United States Patent
Sharma

(10) Patent No.: US 8,158,530 B2
(45) Date of Patent: Apr. 17, 2012

(54) METHODS FOR RETAINING METAL-COMPRISING MATERIALS USING LIQUID CHEMISTRY DISPENSE SYSTEMS FROM WHICH OXYGEN HAS BEEN REMOVED

(75) Inventor: Balgovind Sharma, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 864 days.

(21) Appl. No.: 12/208,159

(22) Filed: Sep. 10, 2008

(65) Prior Publication Data

US 2010/0062609 A1    Mar. 11, 2010

(51) Int. Cl.
*H01L 21/302* (2006.01)
(52) U.S. Cl. .......... 438/745; 438/689; 438/692; 134/21; 134/30
(58) Field of Classification Search .......... 438/689, 438/692, 745; 134/21, 30
See application file for complete search history.

(56) References Cited

U.S. PATENT DOCUMENTS

| | | | | |
|---|---|---|---|---|
| 4,451,554 A | * | 5/1984 | Kishi et al. | 430/313 |
| 4,859,435 A | * | 8/1989 | Roberts et al. | 423/219 |
| 5,069,244 A | * | 12/1991 | Miyazaki et al. | 137/209 |
| 5,759,287 A | * | 6/1998 | Chen et al. | 134/21 |
| 6,139,770 A | * | 10/2000 | Katsumoto et al. | 252/188.28 |
| 6,749,691 B2 | * | 6/2004 | Misra et al. | 134/3 |
| 6,833,081 B2 | * | 12/2004 | Chen et al. | 216/100 |

* cited by examiner

*Primary Examiner* — Nadine G Norton
*Assistant Examiner* — Maki Angadi
(74) *Attorney, Agent, or Firm* — Ingrassia Fisher & Lorenz, P.C.

(57) ABSTRACT

Methods for fabricating a semiconductor device from a semiconductor substrate having a metal-comprising material and a disposable material are provided. In accordance with an exemplary embodiment, the method comprises providing a system for exposing the disposable material to a liquid chemistry and removing oxygen from the system. The disposable material is exposed to the liquid chemistry and is removed from the semiconductor substrate using the liquid chemistry and simultaneously the metal-comprising material is left substantially in tact.

20 Claims, 1 Drawing Sheet

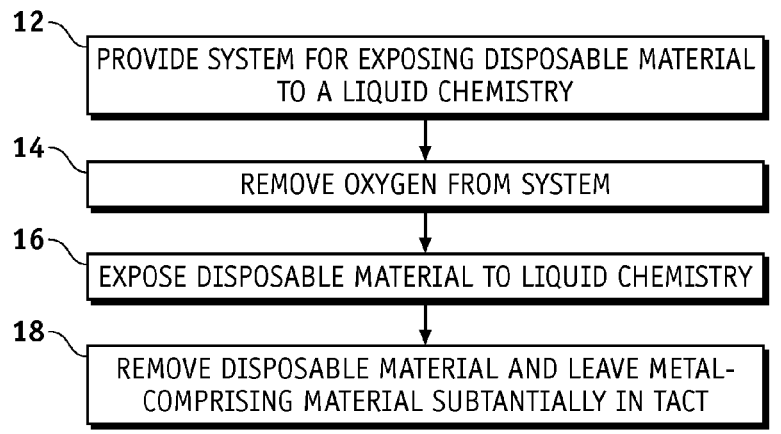
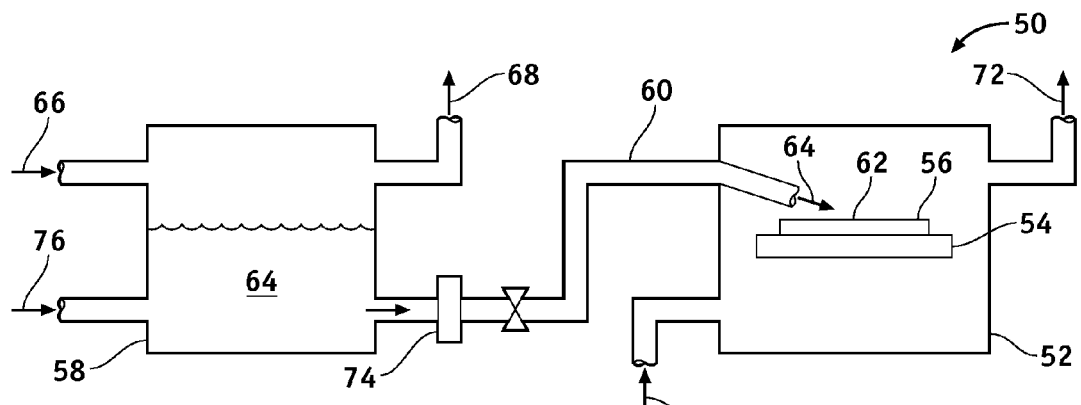
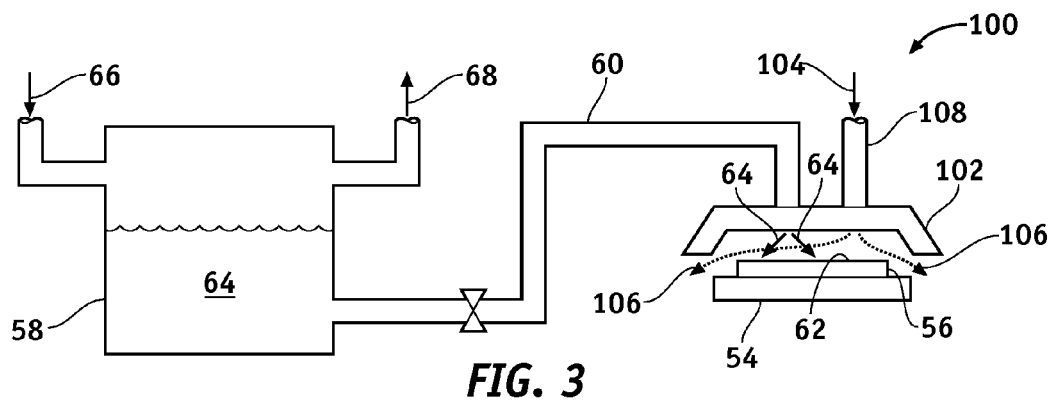
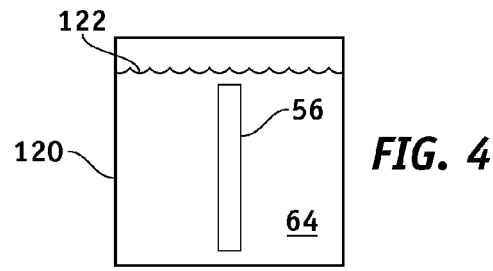

METHODS FOR RETAINING METAL-COMPRISING MATERIALS USING LIQUID CHEMISTRY DISPENSE SYSTEMS FROM WHICH OXYGEN HAS BEEN REMOVED

FIELD OF THE INVENTION

The present invention generally relates to methods for fabricating semiconductor devices, and more particularly relates to methods for retaining metal-comprising materials of semiconductor substrates when exposed to liquid chemistries using liquid chemistry dispense systems from which oxygen has been removed.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs and the IC is then referred to as a complementary MOS or CMOS integrated circuit (IC). There is a continuing trend to incorporate more and more circuitry on a single IC chip. To incorporate the increasing amount of circuitry, the size of each individual device in the circuit and the size and spacing between device elements (the feature size) must decrease.

High dielectric constant materials, also referred to as "high-k dielectrics," such as hafnium dioxide ($HfO_2$), hafnium silicate oxide nitride (HfSiON), or zirconium dioxide ($ZrO_2$), are considered for the 45 nm node technology and beyond to allow further scaling of gate dielectrics. To prevent Fermi-level pinning, metal gates (MG) with the proper work function are used as gate electrodes on the high-k gate dielectrics. Such metal gate electrodes typically are formed of a metal-comprising material such as lanthanum (La), aluminum (Al), magnesium (Mg), ruthenium (Ru), titanium-based materials such as titanium (Ti) and titanium nitride (TiN), tantalum-based materials such as tantalum (Ta) and tantalum nitride (TaN) or tantalum carbide ($Ta_2C$), or the like. Often, a thin oxide forms on the metal-comprising material when exposed to an ambient environment. The oxide may serve as protection of the metal-comprising material from contamination.

Typically during fabrication of a semiconductor device, a metal-comprising material is exposed to liquid chemistries, such as solvents and/or aqueous solutions, used to remove disposable materials. However, during such exposure, at least a portion of the metal-comprising material also may be removed, resulting in catastrophic effects on the performance of subsequently-formed devices. For example, features, such as metal gates, are formed via photolithography using a patterned photoresist material. The photoresist material is utilized as a mask to define device features, such as gate electrodes, in the metal-comprising material of a semiconductor wafer. After the features are formed, the photoresist is removed from the features. Photoresist typically is removed using a sulfuric acid/hydrogen peroxide mixture (SPM), propylene glycol methyl ether acetate (PGMEA), solvents such as n-methylpyrrolidone (NMP), polyethylene glycol (PEG), and commercial strippers such as AZ400T available from Clariant of Switzerland, or a dry chemistry, such as a plasma. However, these conventional removal methods prove unsatisfactory for the removal of photoresist from metal-comprising material, such as that used to form metal gate electrodes.

For example, SPM is an aqueous-based composition with a pH of about 1 and thus results in removal of not only the resist but also at least some of the metal-comprising material and any oxide formed thereon. Removal of any portion of the metal-comprising material and/or its oxide can result in an increase in the threshold voltage (Vt) of a subsequently-formed MOSFET. In addition, wet chemistries often are followed by deionized water rinses that also can remove a portion of the metal-comprising material, thereby adversely affecting Vt. PGMEA and various solvents tend to leave residue particles on the metal-comprising material, which results in high defectivity. Dry chemistries typically do not remove all of the photoresist and, thus, have to be followed by wet chemistry etches, such as with SPM, PGMEA or solvents, that in turn present the same issues set forth above.

Accordingly, it is desirable to provide methods for fabricating a semiconductor device that retain a metal-comprising material when exposed to a liquid chemistry used to remove a disposable material. In addition, it is desirable to provide methods for retaining metal-comprising materials of a semiconductor substrate when exposed to liquid chemistries by using liquid chemistry dispense systems from which oxygen has been removed. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for fabricating a semiconductor device from a semiconductor substrate having a metal-comprising material and a disposable material is provided in accordance with an exemplary embodiment of the present invention. The method comprises providing a system for exposing the disposable material to a liquid chemistry and removing oxygen from the system. The disposable material is exposed to the liquid chemistry and the disposable material is removed from the semiconductor substrate using the liquid chemistry and simultaneously the metal-comprising material is left substantially in tact.

A method for removing a disposable material from a semiconductor substrate, wherein the semiconductor substrate has a metal-comprising material, is provided in accordance with another exemplary embodiment of the present invention. The method comprises removing oxygen from a surface of the semiconductor substrate and applying a liquid chemistry to the disposable material and the metal-comprising material. The disposable material is removed from the semiconductor substrate using the liquid chemistry without substantial removal of the metal-comprising material.

A method for removing a disposable material from a semiconductor substrate, wherein the semiconductor substrate has a metal-comprising material layer, is provided in accordance with a further exemplary embodiment of the present invention. The method comprises removing oxygen from a liquid chemistry such that the liquid chemistry has no more than 30 parts-per-billion of dissolved oxygen. The disposable material is exposed to the liquid chemistry and the disposable material is removed from the semiconductor substrate without substantial removal of the metal-comprising material layer.

BRIEF DESCRIPTION OF THE DRAWINGS

The present invention will hereinafter be described in conjunction with the following drawing figures, wherein like numerals denote like elements, and wherein:

FIG. 1 is a flowchart of a method for fabricating a semiconductor device that retains a metal-comprising material when exposed to a liquid chemistry used to remove a disposable material;

FIG. 2 is a schematic, cross-sectional view of a closed system for exposing a semiconductor substrate to a liquid chemistry in accordance with an exemplary embodiment of the present invention;

FIG. 3 is a schematic, cross-sectional view of an open system for exposing a semiconductor substrate to a liquid chemistry in accordance with another exemplary embodiment of the present invention; and FIG. 4 is a schematic, cross-sectional view of a system for exposing a semiconductor substrate to a liquid chemistry in accordance with a further exemplary embodiment of the invention.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Methods for fabricating a semiconductor device that retain a metal-comprising material when exposed to a liquid chemistry used to remove a disposable material are provided herein. Liquid chemistries, such as solvents (e.g., NMP, PEG, methyl isobutyl ketone (MIBK), cyclohexanone, anisole, ethylene glycol, and the like), AZ400T, HCl, deionized water (DIW), or low-pH chemistries (pH less than about 7), are used to remove various disposable materials, such as photoresists, oxides, contaminants, other liquid chemistries, and the like, from a semiconductor substrate. When a metal-comprising material, such as La, Al, Mg, Ru, Ti, TiN, Ta, TaN, or $Ta_2C$ typically used with high-k dielectric materials, is exposed to such liquid chemistries having dissolved oxygen, and/or when exposed to the liquid chemistry in the presence of oxygen, the metal-comprising material undergoes an oxidation reaction that causes the metal-comprising material to dissolve into the liquid chemistry. For example, when exposed to a typical liquid chemistry, such as SPM, PGMEA, DIW, or HCl having dissolved oxygen, or when exposed to the liquid chemistry in the presence of oxygen, lanthanum undergoes the following oxidation reaction:

$$La \rightarrow La^{3+} + 3e^- \tag{1}$$

The trivalent lanthanum ion then goes into the liquid chemistry. In the case of a subsequently-formed MOS device, this removal of the metal-comprising material from the semiconductor substrate can result in a shift of the threshold voltage of the device, thus degrading the device's performance. In the presence of oxygen, the following reduction reaction or similar reaction occurs:

$$O_2 + H_2O + 4e^- \rightarrow 4OH^- \tag{2}$$

The oxygen of equation (2) or similar reaction serves as an electron sink for the electrons from the metal-comprising material. Thus, the reaction of equation (1) cannot proceed without the oxygen in equation (2). Accordingly, when the metal-comprising material is deprived of oxygen when exposed to the liquid chemistry, it will not undergo an oxidation reaction and will not dissolve into the liquid chemistry and thus will remain substantially in tact without substantial removal thereof. As used herein, the terms "substantially in tact" and "without substantial removal" means that any removal of the metal-comprising material does not result in a change of an electrical characteristic of a device formed with the metal-comprising material compared to an electrical characteristic of a device formed with the metal-comprising material with no portion of the metal-comprising material removed. In one exemplary embodiment, the terms "substantially in tact" and "without substantial removal" mean an increase of no more than about 5% to about 10% in the threshold voltage (Vt) of a subsequently-formed MOSFET comprising the metal-comprising material. In another exemplary embodiment, the terms "substantially in tact" and "without substantial removal" mean that no more than about 5% to about 10% of the metal-comprising material is removed.

Accordingly, the various exemplary embodiments of the methods described herein utilize liquid chemistry dispense systems from which oxygen has been removed. FIG. 1 is a flowchart of a method 10 for fabricating a semiconductor device from a semiconductor substrate having a metal-comprising material and a disposable material in accordance with an exemplary embodiment of the present invention. The method begins by providing a system for exposing the disposable material to a liquid chemistry (step 12). The semiconductor substrate comprises a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer, or may be a thin layer of silicon on an insulating layer (commonly know as silicon-on-insulator or SOI) that, in turn, is supported by a carrier wafer. The semiconductor substrate may comprise various material layers disposed within and/or on the semiconductor material and may comprise various semiconductor devices formed within and/or on the semiconductor material. The semiconductor substrate also comprises a metal-comprising material. Examples of metal-comprising materials of the semiconductor substrate include, but are not limited to, La, Al, Mg, Ru, Ti, TiN, Ta, TaN, $Ta_2C$ and other metals used as metal gate materials with high-k dielectric material gate insulators. Preferably, the metal-comprising material is lanthanum.

The liquid chemistry is applied to the semiconductor substrate to remove a disposable material overlying the semiconductor substrate. The disposable material may comprise, for example, photoresist, oxide residues and/or other residues, previously-used liquid chemistries, and the like. Alternatively, the disposable material may include other metal or metal-comprising material that, for example, may be removed during the formation of a dual gate CMOS device. As used herein, the term "overlying" encompasses the terms "on" and "over". Accordingly, the disposable material can be disposed directly on the semiconductor substrate or may be disposed over the semiconductor substrate such that one or more other materials are interposed between the disposable material and the semiconductor substrate. Examples of materials that may be interposed between the disposable material and the semiconductor substrate include metal interconnect layers, dielectric layers including high-k dielectric layers, semiconductor materials such as silicon, and the like. In another exemplary embodiment, the disposable material is disposed on the metal-comprising material of the semiconductor substrate. The liquid chemistry includes any solvent, cleaner, aqueous solution, non-aqueous-based liquid, or other liquid or liquid mixture suitable for removing the disposable material. Examples of such liquid chemistries include HCl and other low pH chemistries (pH less than about 7), DIW, solvents (e.g., NMP, PEG, methyl isobutyl ketone (MIBK), cyclohexanone, anisole, ethylene glycol, and the like), SPM, PGMEA, AZ400T, and the like.

A system 50 for exposing the disposable material to a liquid chemistry in accordance with one exemplary embodiment is illustrated in FIG. 2. The system 50 comprises a closed chamber 52 within which a semiconductor substrate support device 54 is disposed for holding or supporting a semiconductor substrate 56. The system 50 also comprises a tank or other container 58 in which is stored a liquid chemistry 64. A feed mechanism 60 feeds the liquid chemistry from the container 58 to a surface 62 of the semiconductor substrate 56.

Referring back to FIG. 1, the method 10 continues with the removal of oxygen from the system (step 14). A sufficient amount of oxygen is removed from the system so that, upon exposure to the liquid chemistry, the metal-comprising material remains substantially in tact. Various processes may be used, individually or in combination, to remove the oxygen from the system. In accordance with one exemplary embodiment of the invention, oxygen is removed from the system by purging one or more components of the system with an inert gas such as, for example, nitrogen, helium or argon. For example, referring to FIG. 2, oxygen can be removed from the system by creating a vacuum in the container 58 or, alternatively, by purging the container 58 with inert gas, indicated by arrow 66. In this regard, the container is purged with a sufficient flow of inert gas so that oxygen in the container 58 is removed from the container with the inert gas as an exhaust gas, indicated by arrow 68. In a preferred embodiment, the oxygen is removed such that the liquid chemistry fed through the feed system 60 and supplied to the surface 62 of semiconductor substrate 56 has no more than 30 parts-per-billion (ppb) oxygen. As the partial pressure of oxygen within the container 58 decreases, the oxygen dissolved in the liquid chemistry 64 also may leave the liquid chemistry and be expunged from the container with the exhaust gas.

In accordance with another exemplary embodiment of the invention, oxygen is removed from the system by purging the closed chamber 52 with inert gas, indicated by arrow 70. In this regard, the closed chamber 52 is purged with a sufficient flow of inert gas so that oxygen in the closed chamber and/or oxygen dissolved in the liquid chemistry 64 that is applied to the surface 62 of the semiconductor substrate 56 is removed from the closed chamber with the inert gas as an exhaust gas, indicated by arrow 72.

Oxygen also can be removed directly from the liquid chemistry. For example, referring again to FIG. 2, the liquid chemistry may flow through a deoxygenation membrane 74 that is configured to remove at least a portion of dissolved oxygen from the liquid chemistry. In a preferred embodiment of the invention, the deoxygenation membrane 74 removes dissolved oxygen from the liquid chemistry so that the liquid chemistry has no more than 30 ppb oxygen. An example of a deoxygenation membrane includes, but is not limited to, Liqui-Cel® membrane contactors available from Membrana-Charlotte of Charlotte, N.C. While the deoxygenation membrane is illustrated in FIG. 2 as disposed along the feed mechanism 60, it will be appreciated that the deoxygenation membrane can be disposed at any suitable location of the system.

Dissolved oxygen also can be removed directly from the liquid chemistry by using oxygen scavengers. In one exemplary embodiment, the oxygen scavengers can be added to the liquid chemistry in the container 58, as indicated by arrow 76, although the liquid chemistry can be additionally or alternatively exposed to the oxygen scavengers at any point along the feed mechanism 60. In a preferred embodiment of the invention, the oxygen scavengers remove dissolved oxygen from the liquid chemistry so that the liquid chemistry has no more than 30 ppb oxygen. Examples of suitable oxygen scavengers include ascorbic acid, the AmGuard™ 7800 series of oxygen scavengers available from AmSolv of Lancaster, Tex., diethylhydroxylamine (DEHA), hydrazine, catechol, and the like.

While FIG. 2 illustrates the use of method 10 with a closed system 50, it will be understood that the invention is not so limited and that the method 10 also may be used within an open system, such as the open system 100 of FIG. 3. As with the system 50 of FIG. 2, the system 100 utilizes a container 58 for storing the liquid chemistry 64 and a feed mechanism 60 for transporting the liquid chemistry 64 from the container 58 to surface 62 of semiconductor substrate 56. As with the system 50 of FIG. 2, oxygen can be removed from system 100 by utilizing an inert gas purge of container 58, by inducing a vacuum within container 58, or by using a deoxygenation membrane 74 and/or an oxygen scavenger 76. As an open system, system 100 also may comprise a shield plate 102 or other similar device from which the liquid chemistry is delivered to the surface 62 of semiconductor substrate 56. In accordance with another exemplary embodiment of the invention, oxygen can be removed from the system 100 by purging the surface 62 of semiconductor substrate 56 with inert gas, indicated by arrow 104. In this regard, the surface 62 of semiconductor substrate 56 is purged with a sufficient flow of inert gas so that oxygen proximate the surface 56 and/or oxygen dissolved in the liquid chemistry 64 that is applied to the surface 62 of the semiconductor substrate 56 from the shield plate 102 is removed from the surface 62 as an exhaust gas, indicated by arrow 106. In one embodiment, as shown in FIG. 3, the inert gas can be urged against the surface 62 of semiconductor substrate through a feed 108 coupled to shield plate 102. However, the invention is not limited to this embodiment, and the inert gas can be urged against the surface 62 from any suitable feed disposed relative to the surface 62 so that oxygen at the surface 62 can be removed therefrom.

Referring to FIG. 4, the system of step 12 of method 10 also may comprise a liquid chemistry bath 120 comprising the liquid chemistry 64 in which the semiconductor substrate 56 is submerged. In this regard, the oxygen can be removed from this system by removing dissolved oxygen from the liquid chemistry 64 using, for example, deoxygenation membranes, oxygen scavengers, inert gas purges across a surface 122 of the liquid chemistry 64, and the like. In a preferred embodiment, the dissolved oxygen is removed from the liquid chemistry so that the liquid chemistry comprises no more than 30 ppb oxygen. It will be understood that method 10 also can be performed using any other suitable system for delivering a liquid chemistry to a surface of a semiconductor substrate and from which oxygen can be removed. It also will be understood that any other suitable process for removing oxygen from the system can be used.

Referring back to FIG. 1, after oxygen is removed from the system, or while oxygen is being removed from the system, the disposable material is exposed to the liquid chemistry (step 16). As noted above, the disposable material can be exposed to the liquid chemistry by depositing the liquid chemistry onto a surface of the semiconductor substrate or by submerging the semiconductor substrate in the liquid chemistry, depending on the system used. The liquid chemistry can be disposed on the semiconductor substrate by spraying, spinning or rolling the liquid chemistry onto the surface 56 or by any other suitable method. Upon exposure of the disposable material to the liquid chemistry, the disposable material is at least substantially removed from the surface of the semiconductor substrate (step 18). However, because oxygen has been removed from the liquid chemistry dispense system used to expose the semiconductor substrate to the liquid chemistry, the metal-comprising material remains substantially intact.

Methods for fabricating a semiconductor device that retain a metal-comprising material when exposed to a liquid chemistry used to remove a disposable material are provided herein. The disposable material can be substantially removed from a semiconductor substrate so that residue that may compromise the performance of the subsequently-formed semiconductor device does not remain; however, no substantial amount of metal-comprising material is removed from the semiconductor substrate during the liquid chemistry exposure so that electrical properties of the subsequently-formed semiconductor device are not adversely affected.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor device from a semiconductor substrate having a metal-comprising material and a disposable material, the method comprising the steps of:
   providing a system for exposing the disposable material to a liquid chemistry;
   removing molecular oxygen ($O_2$) from the system;
   exposing the disposable material to the liquid chemistry; and
   removing the disposable material from the semiconductor substrate using the liquid chemistry and simultaneously leaving the metal-comprising material substantially in tact, wherein no more than 30 ppb of molecular oxygen ($O_2$) is exposed to the metal-comprising material while removing the disposable material.

2. The method of claim 1, wherein the step of providing comprises providing a system having a container for storing the liquid chemistry and wherein the step of removing comprises performing an inert gas purge of the container.

3. The method of claim 1, wherein the step of providing comprises providing a system having a container for holding the liquid chemistry and wherein the step of removing comprises inducing a vacuum within the container.

4. The method of claim 1, wherein the step of providing comprises providing a system having a closed chamber within which to expose the semiconductor substrate to the liquid chemistry and wherein the step of removing comprises performing an inert gas purge of the closed chamber.

5. The method of claim 1, wherein the step of removing comprises purging a surface of the semiconductor substrate with an inert gas.

6. The method of claim 1, wherein the step of removing comprises removing molecular oxygen ($O_2$) from the liquid chemistry by flowing the liquid chemistry through a deoxygenation membrane.

7. The method of claim 1, wherein the step of removing comprises removing molecular oxygen ($O_2$) from the liquid chemistry by subjecting the liquid chemistry to an oxygen scavenger.

8. The method of claim 1, where in the step of exposing comprising spraying the liquid chemistry onto the semiconductor substrate.

9. The method of claim 1, where in the step of exposing comprising submerging the semiconductor substrate into the liquid chemistry.

10. The method of claim 1, wherein the disposable material is a photoresist and wherein the step of exposing comprises exposing the photoresist to a composition comprising SPM, PGMEA, DIW, or a solvent.

11. The method of claim 1, wherein the disposable material is formed of a metal and wherein the step of exposing comprises exposing the metal to a composition comprising HCl, DIW, a solvent, or a liquid chemistry having a pH less than 7.

12. The method of claim 1, wherein the metal-comprising material comprising a metal selected from the group consisting of lanthanum, aluminum, magnesium, ruthenium, titanium, titanium nitride, tantalum, tantalum nitride, tantalum carbide, and a combination thereof, and wherein the step of exposing comprises exposing the metal-comprising material to the liquid chemistry.

13. The method of claim 1, where in the step of exposing comprising exposing the disposable material to a liquid chemistry having no more than 30 ppb of molecular oxygen ($O_2$).

14. A method for removing a disposable material from a semiconductor substrate, wherein the semiconductor substrate has a metal-comprising material, the method comprising:
   removing molecular oxygen ($O_2$) from a surface of the semiconductor substrate;
   applying a liquid chemistry to the disposable material and the metal-comprising material; and
   removing the disposable material from the semiconductor substrate using the liquid chemistry without substantial removal of the metal-comprising material, wherein no more than 30 ppb of molecular oxygen ($O_2$) is exposed to the metal-comprising material while removing the disposable material.

15. The method of claim 14, wherein the step of removing comprises purging the surface of the semiconductor substrate with an inert gas.

16. The method of claim 14, wherein the step of removing comprises placing the semiconductor substrate within a closed chamber and inducing a vacuum within the closed chamber.

17. The method of claim 14, wherein the step of applying comprises applying the liquid chemistry to a metal-comprising material comprising a metal selected from the group consisting of lanthanum, aluminum, magnesium, ruthenium, titanium, titanium nitride, tantalum, tantalum nitride, tantalum carbide, and a combination thereof.

18. A method for removing a disposable material from a semiconductor substrate, wherein the semiconductor substrate has a metal-comprising material, the method comprising:
   removing molecular oxygen ($O_2$) from a liquid chemistry such that the liquid chemistry has no more than 30 ppb of dissolved molecular oxygen ($O_2$);

exposing the disposable material to the liquid chemistry; and removing the disposable material from the semiconductor substrate without substantial removal of the metal-comprising material, wherein no more than 30 ppb of molecular oxygen ($O_2$) is exposed to the metal-comprising material while removing the disposable material.

19. The method of claim 18, wherein the step of removing comprises removing molecular oxygen ($O_2$) from the liquid chemistry using a deoxygenation membrane.

20. The method of claim 18, wherein the step of removing comprises removing molecular oxygen ($O_2$) from the liquid chemistry using an oxygen scavenger.

* * * * *